United States Patent
Sato (10) Patent No.: US 11,150,844 B2
(45) Date of Patent: Oct. 19, 2021

(54) REFLOW ENDURANCE IMPROVEMENTS IN TRIPLE-LEVEL CELL NAND FLASH

(71) Applicant: Micron Technology, Inc., Boise, ID (US)

(72) Inventor: Junichi Sato, Yokohama (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/281,740

(22) Filed: Feb. 21, 2019

(65) Prior Publication Data

US 2020/0272363 A1    Aug. 27, 2020

(51) Int. Cl.
- G06F 3/06 (2006.01)
- G11C 11/56 (2006.01)
- G11C 16/04 (2006.01)

(52) U.S. Cl.
CPC .......... *G06F 3/0661* (2013.01); *G06F 3/0608* (2013.01); *G06F 3/0653* (2013.01); *G06F 3/0659* (2013.01); *G06F 3/0679* (2013.01); *G11C 11/5621* (2013.01); *G11C 16/0483* (2013.01)

(58) Field of Classification Search
CPC .... G06F 3/0608; G06F 3/0653; G06F 3/0659; G06F 3/0661; G06F 3/0679; G11C 11/5621; G11C 16/0483
See application file for complete search history.

(56) References Cited

U.S. PATENT DOCUMENTS

| | | |
|---|---|---|
| 9,547,588 B1 | 1/2017 | Biederman et al. |
| 2008/0112221 A1 | 5/2008 | Park et al. |
| 2010/0169547 A1 * | 7/2010 | Ou ............... G06F 12/0246 711/103 |
| 2011/0107049 A1 | 5/2011 | Kwon et al. |
| 2011/0199823 A1 | 8/2011 | Bar-or et al. |
| 2012/0224425 A1 | 9/2012 | Fai et al. |
| 2013/0145085 A1 * | 6/2013 | Yu ................ G06F 12/0246 711/103 |
| 2013/0326313 A1 | 12/2013 | Khan |
| 2014/0250257 A1 | 9/2014 | Khan et al. |
| 2014/0281167 A1 | 9/2014 | Danilak et al. |
| 2014/0281170 A1 | 9/2014 | Cho et al. |
| 2014/0340246 A1 * | 11/2014 | Wu ...................... H03M 7/40 341/65 |

(Continued)

OTHER PUBLICATIONS

Parnell, Thomas. NAND Flash Basics & Error Characteristics: Why Do We Need Smart Controllers. Flash Memory Summit 2016 [retrieved on Jan. 16, 2021], Retrieved from the Internet <URL: https://www.flashmemorysummit.com/English/Collaterals/Proceedings/2016/20160808_PreConfH_Parnell.pdf> (Year: 2016).*

(Continued)

*Primary Examiner* — Larry T Mackall (74) *Attorney, Agent, or Firm* — Greenberg Traurig (57) ABSTRACT

Disclosed is a memory device and method of operating the same. In one embodiment, a method is disclosed comprising generating compressed data by compressing raw data for storage in a memory device, pre-programming a first region of the memory device with the compressed data, and, in response to detecting that the memory device has powered on, decompressing the compressed data, obtaining the raw data, and transferring the raw data to a second region of the memory device.

11 Claims, 4 Drawing Sheets

(56) References Cited

U.S. PATENT DOCUMENTS

| | | |
|---|---|---|
| 2015/0092488 A1 | 4/2015 | Wakchaure et al. |
| 2015/0143026 A1 | 5/2015 | Reddy et al. |
| 2016/0125059 A1 | 5/2016 | Jain et al. |
| 2016/0268000 A1 | 9/2016 | Thompson et al. |
| 2016/0371190 A1 | 12/2016 | Romanovskiy |
| 2017/0017281 A1 | 1/2017 | Artman et al. |
| 2017/0153814 A1 | 6/2017 | Ryu et al. |
| 2017/0206979 A1 | 7/2017 | Cohen et al. |
| 2018/0039537 A1* | 2/2018 | Chih ................. G11C 17/16 |
| 2019/0050153 A1 | 2/2019 | Yang et al. |
| 2019/0095321 A1* | 3/2019 | Lin .................. G06F 3/0679 |
| 2020/0042223 A1 | 2/2020 | Li |
| 2020/0293439 A1 | 9/2020 | Kodama |

OTHER PUBLICATIONS

International Search Report and Written Opinion, PCT/US2020/019001, dated Jun. 15, 2020.
International Search Report and Written Opinion, PCT/US2021/015266, dated Apr. 22, 2021.
International Search Report and Written Opinion, PCT/US2021/015265, dated May 13, 2021.

* cited by examiner

REFLOW ENDURANCE IMPROVEMENTS IN TRIPLE-LEVEL CELL NAND FLASH

TECHNICAL FIELD

The present disclosure relates generally to semiconductor memory and methods, and more particularly, to improvements in triple-level cell NAND Flash operation during manufacturing.

BACKGROUND

Flash memory is a non-volatile storage medium that does not require a power source to maintain data. NAND Flash is a type of Flash memory constructed using NAND logic gates. Alternatively, NOR Flash is a type of Flash memory constructed using NOR logic gates. Currently, the use of NAND Flash predominates the Flash market.

In Flash memories, NAND or NOR transistors are used to store information and are arranged in arrays or grids of gates accessible via bit and word lines, the intersection of which is referred to as a cell. The simplest Flash memories store one bit of information per cell and are referred to as single-level cell (SLC) Flash memories. In a multi-level cell (MLC) Flash, a cell stores more than one bit of information. Specifically, traditionally MLC Flash has stored two bits of information per cell. Correspondingly, triple-level cell (TLC) Flash stores three bits of information are stored per-cell and a quad-level cell (QLC) Flash stores four bits of information per cell. MLC, TLC, and QLC Flash are referred to collectively as "multiple cell Flash."

The principle tradeoffs between SLC and multiple cell Flash are cost and speed. SLC Flash, storing one bit per cell, has the fastest access times but also costs significantly more than MLC, TLC, and QLC Flash. Conversely, QLC Flash is the slowest to access but has the lowest cost. MLC and TLC Flash fall between SLC Flash and QLC Flash, wherein MLC Flash is faster and more expensive than TLC and TLC Flash is faster and more expensive than TLC, both however are slower and cheaper than SLC. Additionally, multiple cell Flash has lower endurance than SLC Flash and suffers from higher error rates and heat sensitivity.

A hybrid type of Flash is referred to as pseudo SLC (pSLC). In a pSLC Flash device, a physical MLC or TLC Flash array is operated in SLC "mode." That is, despite having multiple transistors per cell, the MLC/TLC Flash array only utilizes one of these cells, effectively acting as an SLC device. pSLC Flash is sometimes referred to as enhanced MLC (eMLC), iSLC, super MLC, MLC+, turbo MLC, and other names.

Generally, during manufacture, Flash memories—including MLC and TLC memories, are pre-programmed with data prior to being communicatively coupled to a controller, circuit board, or other connected device via reflow soldering. As known in the art, during reflow soldering, the NAND Flash array is subjected to extremely high temperatures when placed in a reflow oven. Specifically, the three times reflow in TLC Flash, respectively, results in significantly weaker heat affection than in MLC or SLC Flash. As a result, pre-programmed data in TLC Flash memories is frequently corrupted during reflow soldering. Current solutions attempt to remedy this problem by placing TLC Flash memories (which have lower costs) into pSLC mode which can handle the reflow heat affection with minimal to no data loss. However, this approach reduces the capacity of the TLC by one third. The disclosed embodiments remedy these and other deficiencies of existing TLC Flash memories.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DETAILED DESCRIPTION

The following disclosure describes various embodiments for improving the operation of Flash memories. In the illustrated embodiment, the disclosed embodiments describe a configuration of TLC NAND Flash memory such that a portion of the TLC memory functions as pSLC Flash while the remainder operates as TLC Flash. A controller is modified to include a codec which can be used to compress data prior to manufacturing. This compressed data is pre-programmed into the pSLC Flash region of the memory. The controller is further modified to detect the time the memory powers up. In response, the controller blocks access to the memory and decompresses the data from the pSLC region. The decompressed data is then written to the TLC region. This operation ensures that data pre-programmed in the pSLC region is not corrupted during reflow soldering while ensuring that the capacity of TLC Flash memory is exploited during use.

Figure 1:
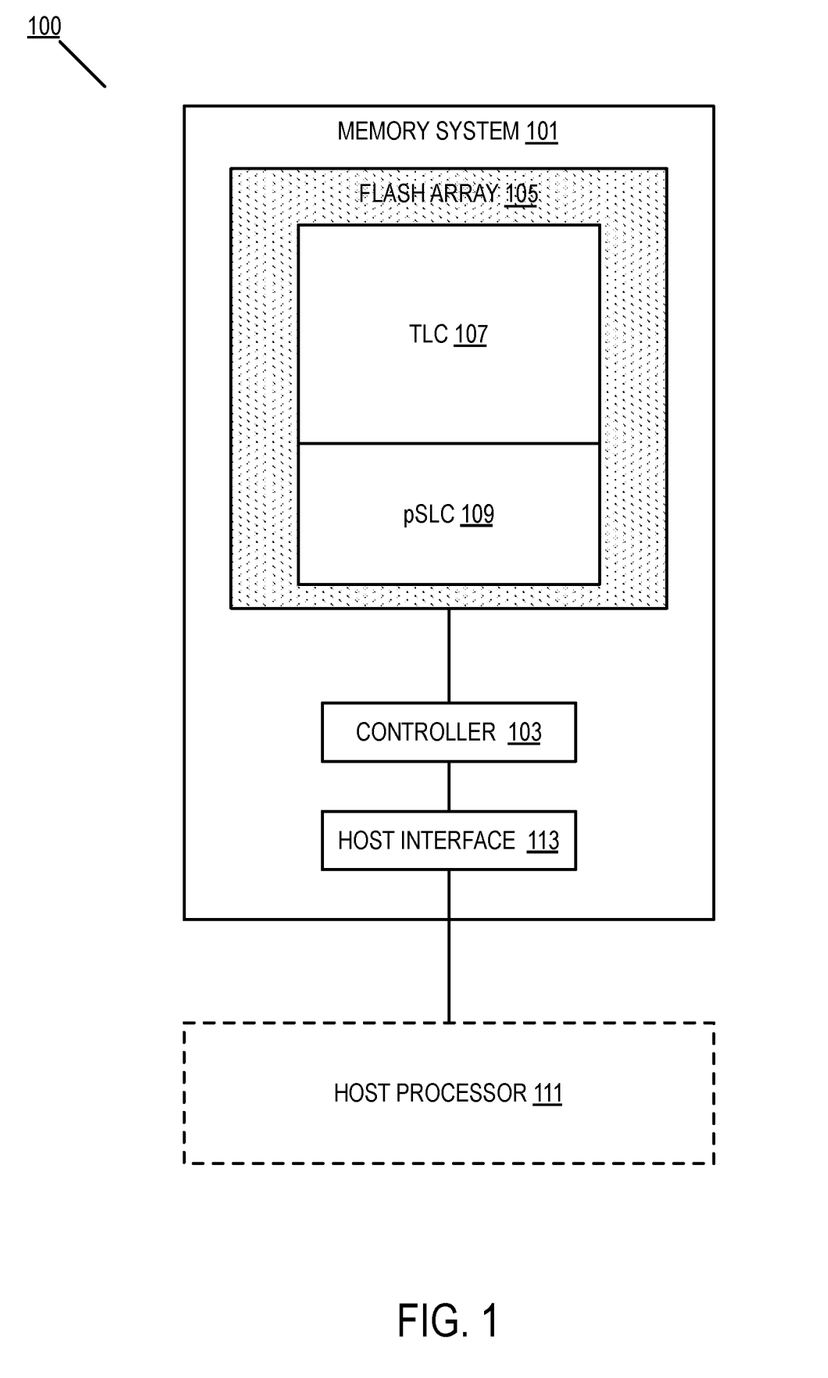
FIG. 1 is a block diagram of a computing system stem according to some embodiments of the disclosure.

FIG. 1 is a block diagram of a computing system stem according to some embodiments of the disclosure.

In the illustrated embodiment, the computing system (100) includes a memory system (101) and a host processor (111). In one embodiment, the memory system (101) comprises a managed NAND Flash device. In one embodiment, the memory system (101) comprises a solid state drive (SSD).

In the illustrated embodiment, the host interface (113) can be used to transfer data between the memory system (101) and a host processor (111). The interface (113) can be in the form of a standardized interface. For example, when the memory system (101) is used for data storage in a computing system 101, the interface (113) can be a serial advanced technology attachment (SATA), a serial attached SCSI (SAS), a peripheral component interconnect express (PCIe), or a universal serial bus (USB), among other connectors and interfaces. In general, however, interface (113) can provide an interface for passing control, address, data, and other signals between the memory system (101) and a host processor (111) having compatible receptors for the interface (113). Host processor (111) can be a host system such as a personal laptop computer, a desktop computer, a digital camera, a mobile telephone, or a memory card reader, among various other types of hosts. Host processor (111) can include a system motherboard and/or backplane and can include a number of memory access devices (e.g., a number of processors). As will be described herein, the host processor (111) can comprise a device configured to pre-program data within memory system (101). However, the host processor (111) may additionally comprise a data reading and writing data to the memory system (101) after manufacturing.

The memory system (101) receives commands from the host processor (111) via the host interface (113) which relays the commands to controller (103).

The controller (103) can communicate with the Flash array (105) to control data read, write, and erase operations, among other operations described herein. The controller (103) can include, for example, a number of components in the form of hardware and/or firmware (e.g., one or more integrated circuits) and/or software for controlling access to the memory and/or for facilitating data transfer between the host processor (111) and memory system (101).

Figure 4:
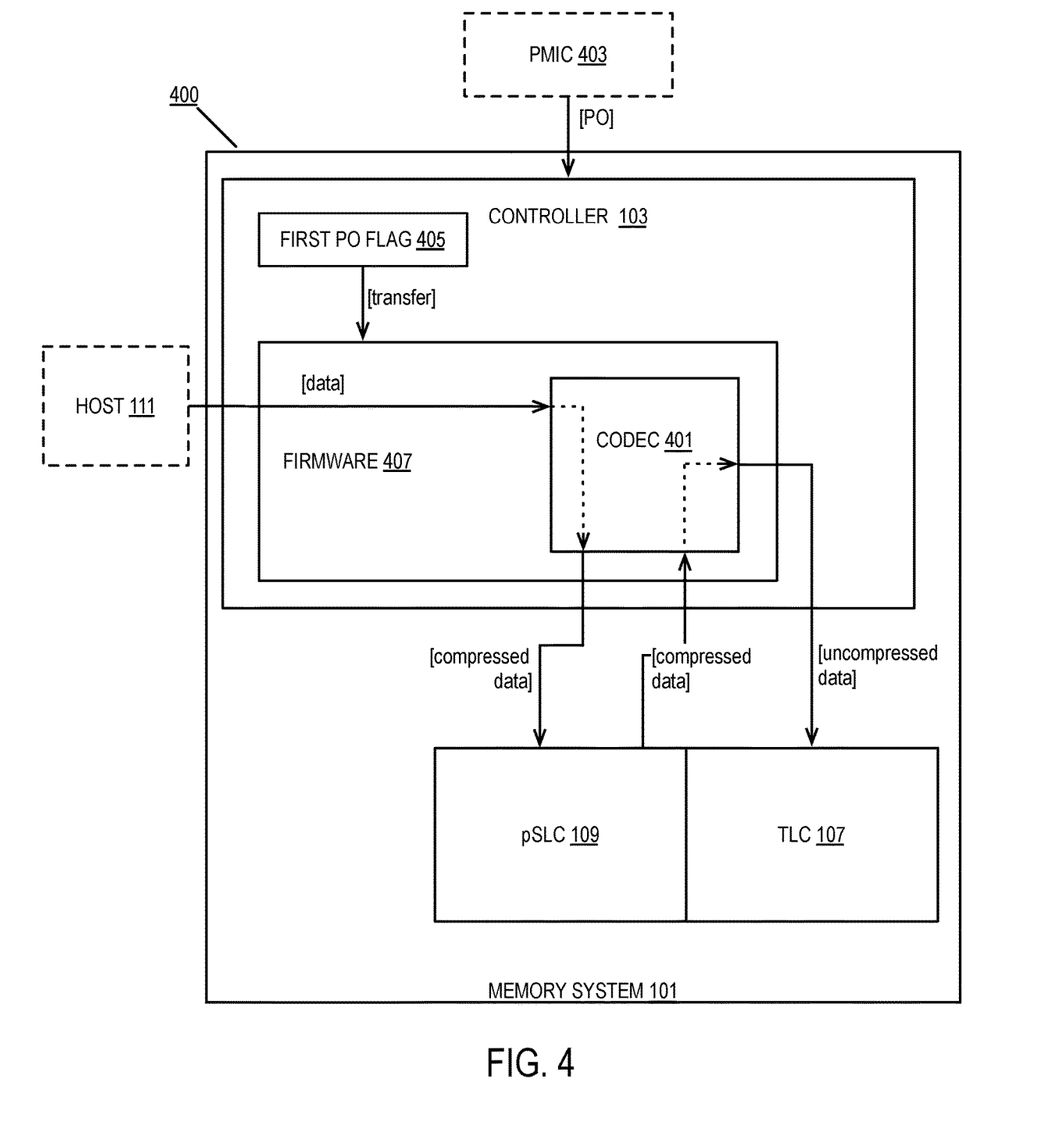
FIG. 4 is a block diagram of a computing system stem according to some embodiments of the disclosure.

In some embodiments, the, the controller (103) includes a host I/O management component, a flash translation layer (FTL), and a memory unit management component. The aforementioned components, and others, are not illustrated in FIG. 1 for the sake of clarity. FIG. 4 provides further detail of relevant components of the controller, the disclosure of which is incorporated herein by reference in its entirety.

In embodiments in which the memory (e.g., Flash array (105)) includes a number of arrays of memory cells, the arrays can be flash arrays with a NAND architecture, for example. However, embodiments are not limited to a particular type of memory array or array architecture. The memory cells can be grouped, for instance, into a number of blocks, which are erased together as a group and can store a number of pages of data per block. A number of blocks can be included in a plane of memory cells and an array can include a number of planes. As used herein, a "page of data" refers to an amount of data that the controller (103) is configured to write/read to/from the Flash array (105) as part of a single write/read operation and can be referred to as a "flash page". As an example, a memory device may have a page size of 8 KB (kilobytes) and may be configured to store 128 pages of data per block, 2048 blocks per plane, and 16 planes per device.

Unlike with traditional hard disk drives, data stored in Flash array (105) cannot be directly overwritten. That is, a block of flash cells must be erased prior to rewriting data thereto (e.g., a page at a time). In some embodiments, the controller (103) can manage data transferred between the host processor (111) and the Flash array (105) via a logical to physical mapping scheme. For instance, a flash translation layer can employ a logical addressing scheme (e.g., logical block addressing (LBA)). As an example, when new data received from host processor (111) is to replace older data already written to Flash array (105), the controller (103) can write the new data in a new location on Flash array (105) and the logical to physical mapping of FTL can be updated such that the corresponding logical address(es) associated with the new data being written indicates (e.g., points to) the new physical location. The old location, which no longer stores valid data, will be erased prior to being written again.

Flash memory cells can be cycled (e.g., programmed/erased) a limited number of times before they become unreliable. The controller (103) can implement wear leveling to control the wear rate on the Flash array (105), which can reduce the number of program/erase cycles performed on a particular group (e.g., block) by spreading the cycles more evenly over the entire array. Wear leveling can include a technique called garbage collection, which can include reclaiming (e.g., erasing and making available for writing), blocks that have the most invalid pages. An invalid page can refer to a page containing invalid data (e.g., a page that no longer has an up to date mapping associated therewith). Alternatively, garbage collection can include reclaiming blocks with more than a threshold amount of invalid pages. If sufficient free blocks exist for a writing operation, then a garbage collection operation may not occur.

Write amplification may occur when writing data to Flash array (105). When randomly writing data to a memory array, the controller (103) scans for available space in the array. Available space in a memory array can be individual cells, pages, and/or blocks of memory cells that are not storing data and/or have been erased. If there is enough available space to write the data in a selected location, then the data is written to the selected location of the memory array. If there is not enough available space in the selected location, the data in the memory array is rearranged by reading, copying, moving, or otherwise rewriting and erasing the data that is already present in the selected location to a new location, leaving available space for the new data that is to be written in the selected location. The relocation of valid data in the memory array is referred to as write amplification because the amount of data written to memory is greater than the amount of data that would occur if there were sufficient available space in the selected location (e.g., the physical amount of data is greater than the logical amount intended to be written). Write amplification is undesirable since it can consume bandwidth, which reduces performance, and can reduce the useful lifetime of an SSD. The amount of write amplification can be effected by various factors such as garbage collection efficiency, wear leveling efficiency, amount of random writes (e.g., writes to non-sequential logical addresses), and/or over-provisioning (e.g., the difference between the physical capacity of flash memory and the logical capacity presented through the operating system as available to the user), among other factors.

The flash translation layer can, in collaboration with a host I/O management component and a mapping unit management component, perform address mapping in accordance with a number of embodiments described herein. In a number of embodiments, the host I/O management component manages data received in association with write commands from the host processor (111) (e.g., prior to mapping via the FTL). The I/O workload of the host processor (111) can be irregular and/or variable. For instance, large file writes (e.g., writes corresponding to a large amount of data) can often be mixed with small writes (e.g., writes corresponding to a small amount of data). In this context, "large" and "small" refer only to a relative difference in size. As an example, a small write may refer to writing of 4 KB of metadata corresponding to a larger file. A large file write may include writing of 128 KB of data, for instance. A large file write may comprise a number of consecutive large file writes. For instance, writing of a 2 GB video file may comprise a number of consecutive 128 KB write commands from the host processor (111).

As illustrated, the Flash array (105) comprises new regions: a TLC region (107) and a pSLC region (109). Notably, the entire Flash array (105) may be manufactured as TLC Flash memory. That is, both regions (107, 109) comprise TLC NAND Flash memory arrays. In some embodiments, these regions are fixed during manufacturing and addressed via firmware code that configured read/write/erase commands based on the corresponding address in the array (105). In alternative embodiments, the pSLC region (109) can be dynamically sized and resized. Since the pSLC region (109) is, physically, the same as TLC region (107), the resizing (or removing) of pSLC region (109) can be accomplished via firmware updates that allow for full addressing of all three NAND gates in the cells of pSLC region (109).

Figure 2:
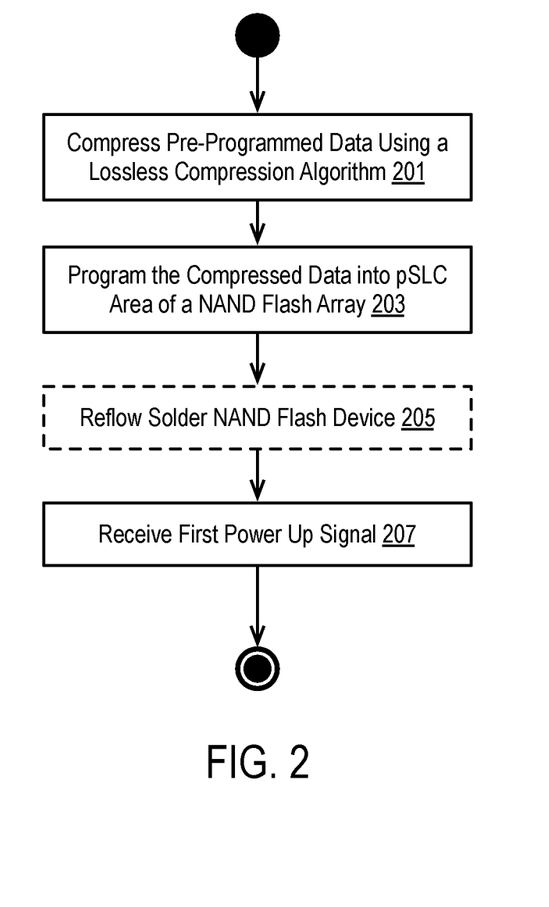
FIG. 2 is a flow diagram illustrating a method for pre-programming a TLC array according to some embodiments of the disclosure.
Figure 3:
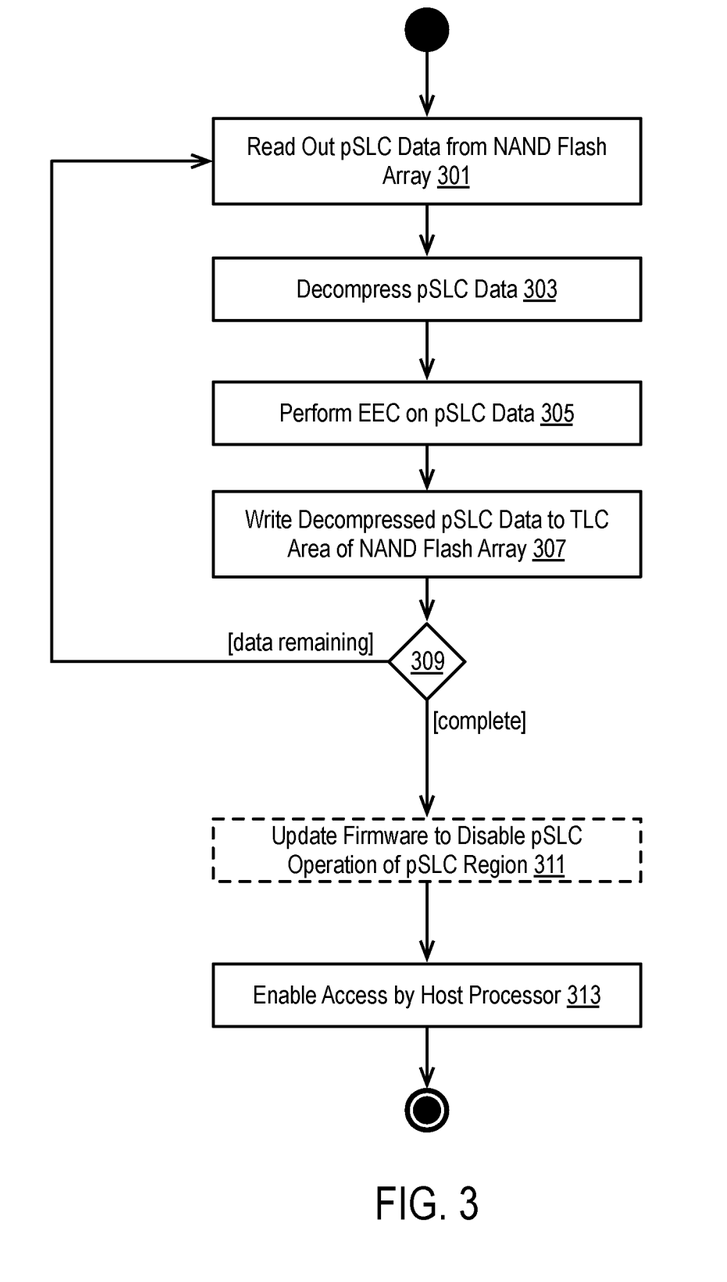
FIG. 3 is a flow diagram illustrating a method for decompressing pSLC data into a TLC memory region according to some embodiments of the disclosure.

Various methods, and alternatives thereof, for operating the illustrated system (100) are described in further detail in the descriptions of FIGS. 2 and 3. Additionally, FIG. 4 provides a more detailed block diagram of the controller (103).

FIG. 2 is a flow diagram illustrating a method for pre-programming a TLC array according to some embodiments of the disclosure.

In step 201, the method compresses pre-programmed data using a lossless compression algorithm.

In many commercial operations, memories are preprogrammed with data prior to installation in, for example, chipsets and circuit boards. This pre-programmed data may comprise bootstrap code, bootloader code, operating system (OS) code, file system data, and other operational data used by the memory system. To reduce costs and complexity during manufacturing, this data is frequently pre-programmed into the memory device during bulk manufacturing. Thus, batches of memory devices are pre-programmed simultaneously prior to downstream usage of the devices.

In existing systems, this data is not compressed, but is rather copied, uncompressed, as the data will be used by downstream applications. For SLC NAND memories, this process is generally satisfactory. Specifically, all memories generally undergo reflow soldering to affix the memories to their ultimate printed circuit boards (PCBs) or other backplanes. As part of the reflow soldering process, the memories are exposed to extremely high temperatures. For SLC NAND memories, this intense heat generally does not corrupt the data pre-programmed in the gates. However, for TLC (and MLC/QLC) memories, the threshold voltages of the multi-level cells are shifted, resulting in data corruption after the heating is completed. Thus, the pre-programmed data is corrupted when the memories are attached to, for example, the final PCBs.

In step 201, the method first compresses the raw data that is to be written to the memory. In one embodiment, this compression may be performed offline or by an external device. In other embodiments, it may be performed by a controller of the memory device itself (received via a host interface, JTAG, etc.). Various lossless compression algorithms may be used such as run-length encodings (RLE), bzip2, Lempel-Ziv compression (and variants thereof), etc. Alternatively, or in conjunction with the foregoing, application-specific compression algorithms may be used based on the data to be written. For example, Free Lossless Audio Codec (FLAC) may be used for audio data or H.264 lossless compression may be used for video data. The specific type of lossless compression algorithm used is not limiting.

In step 203, the method programs the compressed data into a pSLC region of a NAND Flash array.

In the illustrated embodiment, a set of addresses of a NAND Flash array may be designated as a pSLC region. For example, the first N addresses of the array may be designated as the pSLC region. Designating a pSLC region comprises configuring firmware to only write to one bit of the three-bit cells in the pSLC region. In one embodiment, the method accesses the pSLC region simply by writing to the addresses. In other embodiments, a controller of the NAND array provides commands for access the pSLC region. In the illustrated embodiment, the method sequentially writes the compressed data to the pSLC region (e.g., starting at address zero).

In some embodiments, prior to writing, the method confirms whether the size of the compressed data will fit within the pSLC region. If so, the method continues to write the complete compressed data into the pSLC region. If not, the method may selectively decompress a portion of the compressed data and write the decompressed data to the TLC region of the NAND Flash array. In some embodiments, the method may segment the decompressed data into bits and pad each bit with two zeros to simulate pSLC operations in the TLC operation. In some embodiments, the method may distribute the data in the TLC region such that consecutive cells are not written to.

In step 205, the method reflow solders the NAND Flash device executing the method illustrated in FIG. 2. In the illustrated embodiment, step 205 is optional and may be performed by a reflow soldering oven or other heat source. In some embodiments, the soldering is performed automatically as part of a manufacturing process. Techniques for high-heat reflow soldering are known in the art and the details of these techniques are not described herein for the sake of brevity.

In step 207, the method receives a first power up signal.

In one embodiment, a power up signal may be received from a power management integrated circuit (PMIC) or similar device powering the memory device. In other embodiments, the device itself may include power management circuitry (in addition to an external PMIC). In one embodiment, the device implementing the method includes a flag or register file that indicates that the device has powered on for the first time. In some embodiments, this flag may be set during manufacture and cleared upon first power up. In alternative embodiments, it may be set during first power up and set as read only (e.g., in EEPROM). As will be discussed in connection with FIG. 3, the first power up signal indicates that an initialization process should be performed prior to allowing external access to the NAND Flash in the device.

FIG. 3 is a flow diagram illustrating a method for decompressing pSLC data into a TLC memory region according to some embodiments of the disclosure.

In step 301, the method reads out pSLC data from the NAND Flash array.

In one embodiment, step 301 is performed by a controller of a non-volatile memory device and is performed in response to detecting the first power on of the device. For example, after soldering, the memory device may be powered on for testing, during this power on step 301 is performed.

In the illustrated embodiment, the method may copy the contents of the pSLC region to cache memory such as onboard dynamic random-access memory (DRAM) or static random-access memory (SRAM) that is installed as part of the memory device (e.g., in an SSD or similar device). In some embodiments, the method copies the entire contents of the pSLC to cache memory for processing. In other embodiments, the method may stream data from the pSLC region for processing, reducing SRAM/DRAM usage. In some embodiments, the SRAM/DRAM will be sized to accommodate the pSLC region and thus the entire contents of the pSLC can be copied to the cache.

In step 303, the method decompresses the pSLC data.

As described previous, the pSLC data is compressed using a lossless compression algorithm. In one embodiment, this algorithm is executed by a codec represented in the memory device's firmware/controller. Alternatively, the codec can be situated external to the device. In either event, the decompression in step 303 comprises a suitable decompression algorithm based on the selected lossless compression algorithm described in step 201.

In step 305, the method performs error code correction (ECC) on the decompressed data. In some embodiments, the method may perform ECC prior to decompressing as well. The illustrate embodiment does not place a limit on the specific type of ECC employed and, in some embodiments, the method may utilize the ECC installed within the memory device and used during normal operations.

In step 307, the method writes the decompressed pSLC data to the TLC area of the NAND flash array.

In some embodiments, the method may write the decompressed data starting at the first TLC address. The method may write the data sequentially as it is decoded from the start of the pSLC region. In other embodiments, the decompressed data may include indications of addresses in which the data should be written into the TLC region.

In an alternative embodiment, the method may decompress the pSLC and store the data within the cache until all pSLC data is decompressed. The method may then perform a bulk write of the decompressed data to the TLC region. In this embodiment, as will be described, the pSLC region may be removed and return to TLC mode. In this embodiment, the method may copy the decompressed data to the beginning of the entire NAND Flash array.

In step 309, the method checks to determine if all the compressed data in the pSLC region has been decompressed and copied to either the TLC region or to cache memory. If not, the method continues to execute steps 301, 303, 305, and 307 for any remaining data in the pSLC region. Alternatively, if the method determines that all pSLC data has been decompressed, the method continues to step 311.

In step 311, the method updates the controller firmware to disable pSLC operation of the pSLC region. In some embodiments, step 311 is optional.

In an optional embodiment, the method may "reclaim" the pSLC region and operate the pSLC region as TLC NAND Flash memory. Since pSLC utilizes the underlying TLC architecture, the method may modify the firmware to disable pSLC access to the pSLC region. This effectively convert the pSLC region into a TLC region. As described above, if step 311 is executed, in some embodiments, the method may perform step 307 after step 311 by copying the decompressed data stored in cache to the newly expanded TLC region.

In some embodiments, the pSLC region is retained throughout the life of the device. In these embodiments, the compressed data may be retained in the pSLC region. In this manner, TLC region can be "reset" by re-executing steps 301, 303, 305, 307, and 309. For example, the TLC region may, at some point, become corrupted such as, via subsequent re-soldering or other high heat.

In step 313, the method enables access to the TLC region for a host processor. As described above, the method in FIG. 3 may be executed on the first power on of a device (or on the first power up after a corruption). Thus, in the preceding steps, the method may deny access to the Flash array while the steps are being performed. After completion of the process, the method may enable read/write/erase and other operations on the NAND Flash array in accordance with standard interfaces.

FIG. 4 is a block diagram of a computing system stem according to some embodiments of the disclosure.

Like-numbered elements of FIG. 4 correspond to the elements described in FIG. 1 and the description of these components is incorporated by reference in its entirety. FIG. 4 provides a further depiction of the components of memory system (101) implementing the methods described above.

As illustrated in FIG. 4, the controller (103) includes firmware (407) which controls the operation of the memory system (103) as described in connection with FIG. 1. Additionally, the firmware (407) implements a codec (401) that performs the compression and decompression routines described above. The controller (103) additionally includes a flag (405) indicating a first power-on of the memory system (101). As discussed, this flag (405) may be set upon detecting the first power on from a PMIC (403) which although illustrated as external to the memory system (101) may be implemented as part of the memory system (101).

Host (111) accesses the memory system (101) via an interface and can transmit data to the memory system (101). In the illustrated embodiment, this data comprises uncompressed data to write to the pSLC region (109). As illustrated, the firmware (407) handles all commands received via the interface and compresses the data via codec (401). This compressed data is then written to the pSLC region (109). As described, this data may be streamed or transferred in bulk.

When the memory system (101) first powers on, the flag (405) is set by, for example, being triggered from an on to off state during power on in EEPROM. The flag (405) is monitored by the firmware (407) and triggering of the flag causes a transfer operation to be executed. During transfer compressed data is read out of the pSLC region (109), decoded by codec (401) and transferred as uncompressed data into the TLC region (107).

The subject matter disclosed above may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The present disclosure is described with reference to block diagrams and operational illustrations of methods and devices. It is understood that each block of the block diagrams or operational illustrations, and combinations of blocks in the block diagrams or operational illustrations, can be implemented by means of analog or digital hardware and computer program instructions. These computer program instructions can be provided to a processor of a general-purpose computer to alter its function as detailed herein, a special purpose computer, ASIC, or other programmable data processing apparatus, such that the instructions, which execute via the processor of the computer or other programmable data processing apparatus, implement the functions/acts specified in the block diagrams or operational block or blocks. In some alternate implementations, the functions/acts noted in the blocks can occur out of the order noted in the operational illustrations. For example, two blocks shown in succession can in fact be executed substantially concurrently or the blocks can sometimes be executed in the reverse order, depending upon the functionality/acts involved.

These computer program instructions can be provided to a processor of: a general purpose computer to alter its function to a special purpose; a special purpose computer; ASIC; or other programmable digital data processing apparatus, such that the instructions, which execute via the processor of the computer or other programmable data processing apparatus, implement the functions/acts specified in the block diagrams or operational block or blocks, thereby transforming their functionality in accordance with embodiments herein.

For the purposes of this disclosure a computer readable medium (or computer-readable storage medium/media) stores computer data, which data can include computer program code (or computer-executable instructions) that is executable by a computer, in machine readable form. By way of example, and not limitation, a computer readable medium may comprise computer readable storage media, for tangible or fixed storage of data, or communication media for transient interpretation of code-containing signals. Computer readable storage media, as used herein, refers to physical or tangible storage (as opposed to signals) and includes without limitation volatile and non-volatile, removable and non-removable media implemented in any method or technology for the tangible storage of information such as computer-readable instructions, data structures, program modules or other data. Computer readable storage media includes, but is not limited to, RAM, ROM, EPROM, EEPROM, flash memory or other solid-state memory technology, CD-ROM, DVD, or other optical storage, magnetic cassettes, magnetic tape, magnetic disk storage or other magnetic storage devices, or any other physical or material medium which can be used to tangibly store the desired information or data or instructions and which can be accessed by a computer or processor.

For the purposes of this disclosure a module is a software, hardware, or firmware (or combinations thereof) system, process or functionality, or component thereof, that performs or facilitates the processes, features, and/or functions described herein (with or without human interaction or augmentation). A module can include sub-modules. Software components of a module may be stored on a computer readable medium for execution by a processor. Modules may be integral to one or more servers, or be loaded and executed by one or more servers. One or more modules may be grouped into an engine or an application.

Those skilled in the art will recognize that the methods and systems of the present disclosure may be implemented in many manners and as such are not to be limited by the foregoing exemplary embodiments and examples. In other words, functional elements being performed by single or multiple components, in various combinations of hardware and software or firmware, and individual functions, may be distributed among software applications at either the client level or server level or both. In this regard, any number of the features of the different embodiments described herein may be combined into single or multiple embodiments, and alternate embodiments having fewer than, or more than, all the features described herein are possible.

Functionality may also be, in whole or in part, distributed among multiple components, in manners now known or to become known. Thus, myriad software/hardware/firmware combinations are possible in achieving the functions, features, interfaces and preferences described herein. Moreover, the scope of the present disclosure covers conventionally known manners for carrying out the described features and functions and interfaces, as well as those variations and modifications that may be made to the hardware or software or firmware components described herein as would be understood by those skilled in the art now and hereafter.

Furthermore, the embodiments of methods presented and described as flowcharts in this disclosure are provided by way of example to provide a more complete understanding of the technology. The disclosed methods are not limited to the operations and logical flow presented herein. Alternative embodiments are contemplated in which the order of the various operations is altered and in which sub-operations described as being part of a larger operation are performed independently.

While various embodiments have been described for purposes of this disclosure, such embodiments should not be deemed to limit the teaching of this disclosure to those embodiments. Various changes and modifications may be made to the elements and operations described above to obtain a result that remains within the scope of the systems and processes described in this disclosure.

What is claimed is:

1. A method comprising:
   generating compressed data by compressing raw data for storage in a memory device, the memory device comprising triple-level cell (TLC) NAND Flash memory cells;
   configuring a first region of the memory cells to operate as pSLC NAND Flash cells, whereby the first region and a second region of the memory cells comprise an entire storage capacity of the memory device;
   decompressing at least a portion of the compressed data to obtain decompressed data upon determining that a size of the compressed data exceeds a size of the first region;
   extracting a subset of the compressed data after obtaining the decompressed data;
   pre-programming the first region of the memory device with the subset of the compressed data;
   writing the decompressed data to the second region; and in response to detecting that the memory device has powered on:
> decompressing the subset of the compressed data, obtaining the raw data,
> transferring the raw data to the second region of the memory device, and
> converting the first region to a TLC region after transferring the raw data such that the entire storage capacity of the memory device comprise TLC NAND Flash memory cells after the converting.

2. The method of claim 1, the compressing raw data comprising compressing the raw data using a lossless compression algorithm.

3. The method of claim 2, the compressing and decompressing performed by a controller in the memory device.

4. The method of claim 1, further comprising enabling access to the memory by a host processor after transferring the raw data.

5. A non-transitory computer readable storage medium for tangibly storing computer program instructions capable of being executed by a computer processor, the computer program instructions defining steps of:
> generating compressed data by compressing raw data for storage in a memory device, the memory device comprising triple-level cell (TLC) NAND Flash memory cells;
> configuring a first region of the memory cells to operate as pSLC NAND Flash cells, whereby the first region and a second region of the memory cells comprise an entire storage capacity of the memory device;
> decompressing at least a portion of the compressed data to obtain decompressed data upon determining that a size of the compressed data exceeds a size of the first region;
> extracting a subset of the compressed data after obtaining the decompressed data;
> pre-programming the first region of the memory device with the subset of the compressed data;
> writing the decompressed data to the second region; and
> in response to detecting that the memory device has powered on:
> > decompressing the subset of the compressed data, obtaining the raw data,
> > transferring the raw data to the second region of the memory device, and
> > converting the first region to a TLC region after transferring the raw data such that the entire storage capacity of the memory device comprise TLC NAND Flash memory cells after the converting.

6. The non-transitory computer readable storage medium of claim 5, the compressing raw data comprising compressing the raw data using a lossless compression algorithm.

7. The non-transitory computer readable storage medium of claim 5, further comprising enabling access to the memory by a host processor after transferring the raw data.

8. A device comprising:
> a host interface;
> a controller comprising firmware and a codec;
> a NAND Flash memory array;
> the controller configured to:
> > generate compressed data by compressing raw data received via the host interface, the NAND Flash memory array comprising triple-level cell (TLC) NAND Flash memory cells, wherein each cell in the memory cells is configurable to act as either a pseudo single-level cell (pSLC) NAND Flash cell or a TLC NAND Flash cell in response to a control signal;
> > configure a first region of the memory cells to operate as pSLC NAND Flash cells, whereby the first region and a second region of the memory cells comprise an entire storage capacity of a memory device;
> > decompress at least a portion of the compressed data to obtain decompressed data upon determining that a size of the compressed data exceeds a size of the first region;
> > extract a subset of the compressed data after obtaining the decompressed data;
> > pre-program the first region of the NAND Flash memory array with the subset of the compressed data;
> > writing the decompressed data to the second region; and
> > in response to detecting an initial power-on:
> > > decompressing the subset of the compressed data, obtaining the raw data,
> > > transferring the raw data to the second region of the NAND Flash memory array, and
> > > converting the first region to a TLC region after transferring the raw data such that the entire storage capacity of the memory device comprise TLC NAND Flash memory cells after the converting.

9. The device of claim 8, the controller further comprising firmware, the controller configured to update the firmware to convert the first region to a TLC region.

10. The device of claim 8, the compressing raw data comprising compressing the raw data using a lossless compression algorithm.

11. The device of claim 8, the controller further configured to enable access to the NAND Flash memory array by a host processor after transferring the raw data.

* * * * *